(12) United States Patent
Yamada (10) Patent No.: US 10,243,445 B2
(45) Date of Patent: Mar. 26, 2019

(54) SEMICONDUCTOR DEVICE AND CONTROL METHOD THEREOF

(71) Applicant: Renesas Electronics Corporation, Tokyo (JP)

(72) Inventor: Shingo Yamada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,501

(22) Filed: Feb. 20, 2018

(65) Prior Publication Data

US 2018/0301977 A1    Oct. 18, 2018

(30) Foreign Application Priority Data

Apr. 14, 2017    (JP) .................................. 2017-080685

(51) Int. Cl.
| | |
|---|---|
| H02M 1/088 | (2006.01) |
| H03K 17/16 | (2006.01) |
| H02M 7/5395 | (2006.01) |
| H02M 1/00 | (2006.01) |
| H02P 27/08 | (2006.01) |

(52) U.S. Cl.
CPC .......... *H02M 1/088* (2013.01); *H03K 17/165* (2013.01); *H03K 17/166* (2013.01); *H02M 7/5395* (2013.01); *H02M 2001/0054* (2013.01); *H02P 27/08* (2013.01)

(58) Field of Classification Search
CPC ... H02M 1/088; H02M 7/5395; H03K 17/165

USPC ........ 327/108–112, 427, 434, 437, 379–386; 326/82, 83, 87
See application file for complete search history.

(56) References Cited

U.S. PATENT DOCUMENTS

| | | | |
|---|---|---|---|
| 5,811,948 A | 9/1998 | Sato et al. | |
| 6,121,789 A | 9/2000 | Liu et al. | |
| 7,535,258 B1* | 5/2009 | Johnson | H03F 3/45237 326/68 |
| 9,276,472 B2 | 3/2016 | Ooga | |
| 2013/0193937 A1* | 8/2013 | Horie | G05F 1/595 323/271 |
| 2015/0035584 A1 | 2/2015 | Fujita | |

FOREIGN PATENT DOCUMENTS

JP    2014-121164 A    6/2014

OTHER PUBLICATIONS

European Search Report dated Aug. 9, 2018 for European Patent Application No. 18165808.9-1203.

* cited by examiner

*Primary Examiner* — Thomas Skibinski
(74) *Attorney, Agent, or Firm* — McGinn I.P. Law Group, PLLC.

(57) ABSTRACT

The invention addresses providing a semiconductor device that enables to reduce noise simultaneous with switching. A driver IC which is a semiconductor device includes a drive circuit which drives a control terminal of a PMOS drive stage which is a switching element, a noise detection circuit which detects noise in an output signal when switching (turning) the PMOS drive stage on or off, and a control circuit which control driving by the drive circuit based on the detected noise.

17 Claims, 10 Drawing Sheets

SEMICONDUCTOR DEVICE AND CONTROL METHOD THEREOF

CROSS-REFERENCE TO RELATED APPLICATIONS

The disclosure of Japanese Patent Application No. 2017-080685 filed on Apr. 14, 2017 including the specification, drawings and abstract is incorporated herein by reference in its entirety.

BACKGROUND

The present invention relates to a semiconductor device and a control method therefor and concerns, for example, a semiconductor device that drives switching elements and a control method therefor.

In a drive system that drives a load such as a motor for use in a vehicle, switching elements such as power MOSFETs (Metal Oxide Semiconductor Field Effect Transistors) and IGBTs (Insulated Gate Bipolar Transistors) are widely used. Such drive systems are recently evolved to be diversified and adapted for large power applications, as is the case for those for use in vehicles and those for industrial use, and a technology for driving a load under various conditions is hoped for.

As a technical approach related to driving such switching elements, for example, Patent Document 1 is known.

RELATED ART DOCUMENT

Patent Document

[Patent Document 1]
Japanese Unexamined Patent Application Publication No. 2014-121164

SUMMARY

In order to drive a load stably under various conditions, as mentioned above, noise reduction is a significant problem. But, in related art, a problem was posed in which some drive conditions make it hard to reduce noise occurring with switching.

Other problems and novel features will become apparent from the description in the present specification and the accompanying drawings.

According to one embodiment, a semiconductor device includes a drive circuit, a detection circuit, and a control circuit. The drive circuit drives a control terminal of a switching element. The detection circuit detects noise in an output signal when switching the switching element on or off and the control circuit controls driving by the drive circuit based on the detected noise.

According to one embodiment described above, it is possible to reduce noise simultaneous with switching.

DETAILED DESCRIPTION

To clarify explanation, descriptions which will be provided hereinafter and drawings are partially omitted, as appropriate, and simplified. Besides, elements which are described in drawings as functional blocks to perform various processing tasks can be configured, in a hardware aspect, with a CPU, a memory, and other circuits and they are implemented, in a software aspect, with a program or the like which has been loaded into a memory. Therefore, it will be understood by those skilled in the art that these functional blocks can be implemented in various ways, i.e., by only hardware, only software, or hardware/software combination and their implementation is not limited to any one way. And now, in the respective drawings, identical elements are assigned a like designator and their duplicated description is omitted, as necessary.

First Embodiment

In the following, a first embodiment is described with reference to the drawings.
<Configuration of a System of the First Embodiment>
As a system pertaining to the present embodiment, a motor drive system that drives a motor is described here. And now, the motor drive system is one example of a system using switching elements such as power MOSFETs or IGBTs which are power devices and may be any other system that drives a load using switching elements.

Figure 1:
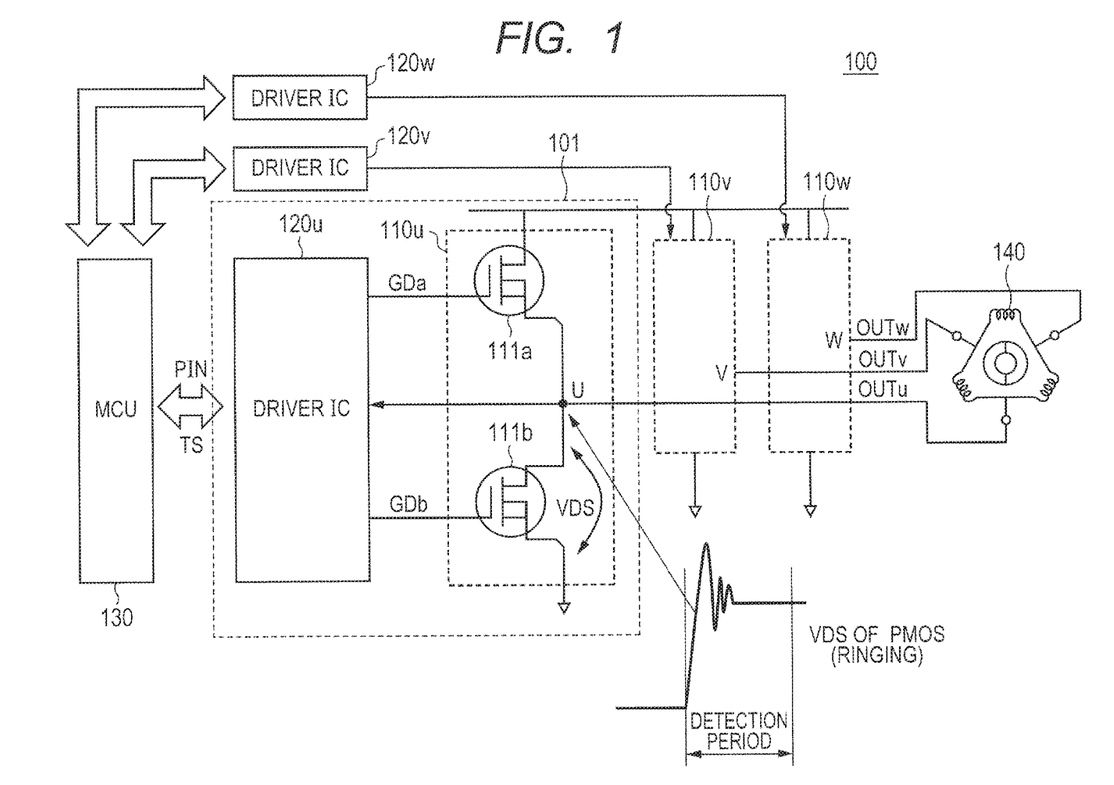
FIG. 1 is a configuration diagram depicting a configuration example of a motor drive system pertaining to a first embodiment.

FIG. 1 depicts a configuration example of the motor drive system pertaining to the present embodiment. The motor drive system pertaining to the present embodiment is, for example, a system for driving a motor that is used in a vehicle, for example, pumping or steering in a 12V/48V power supply system. As depicted in FIG. 1, the motor drive system 100 pertaining to the present embodiment is equipped with plural driver ICs 120, an MCU (Micro Control Unit) 130, plural inverters 110, and a motor 140.

The motor is one example of a load that is driven by the motor drive system 100. The motor 140 is, for example, a brushless DC motor that is driven with three-phase drive output signals OUT (OUTu for phase U, OUTv for phase V, and OUTw for phase W) of different phases.

The inverters 110 (110u, 110v, and 110w) are motor drive circuits to drive the motor 140 by control from the MCU 130 and the driver ICs. The inverters 110 are also conversion circuits to convert input DC power (DC voltage) to AC power (AC voltage) and supply the AC power resulting from the conversion to the motor 140.

Each of the inverters 110 includes a PMOS drive stage (a high side switch) 111a and a PMOS drive stage (a low side switch) 111b coupled in series between first power supply (e.g., 12V/48V power supply) and second power supply (e.g., GND). Each of the PMOS drive stages 111 (111a and 111b) includes a switching element such as a power MOSFET and incorporates a flywheel diode (FWD), which is not depicted, coupled in parallel with the switching element. Although a PMOS transistor (a P-channel type transistor) is used as a switching element in this example, an NMOS transistor (an N-channel type transistor) may be used. For example, a PMOS drive stage 111 including a PMOS transistor and a flywheel diode is configured on a single semiconductor chip (as a single semiconductor device); however, the PMOS transistor and the flywheel diode may be present on separate semiconductor chips respectively. And now, for a large power inverter 110, plural PMOS transistors may be coupled in parallel in each PMOS drive stage 111.

Because the motor 140 is driven with three-phase AC power in this example, three inverters 110u, 110v, and 110w are coupled in parallel. The inverters 110u, 110v, and 110w output drive output signals OUTu, OUTv, and OUTw respectively to the motor 140 from an intermediate node between the PMOS drive stage 111a and the PMOS drive stage 111b. The PMOS drive stages 111a and 111b are turned on/off depending on gate drive signals GDa and GDb from the driver ICs and generate drive output signals OUT (OUTu, OUTv, and OUTw). A drive output signal OUT is also a voltage VDS (a drain-source voltage of a PMOS transistor) of a PMOS drive stage (e.g., 111b).

Each of the driver ICs 120 (120u, 120v, and 120w) is an inverter drive circuit (a gate drive circuit) to drive a control terminal (gate) of each of the PMOS drive stages 111a and 111b in the inverters 110 by control from the MCU 130. Also, each of the driver ICs 120 pertaining to the present embodiment controls driving of the PMOS drive stages 111a and 111b depending on noise in a drive output signal OUT (the voltage VDS) of each of the inverters 110, as will be described later.

To perform drive control with respect to each inverter 110, the driver ICs 120u, 120v, and 120w are provided for the inverters 110u, 110v, and 110w, respectively. Depending on a PWM (Pulse Width Modulation) control signal PIN from the MCU 130, the driver ICs 120u, 120v, and 120w generate gate drive signals GDa and GDb to drive the gate of each of the PMOS drive stages 111a and 111b in the inverters 110u, 110v, and 110w. Besides, each of the inverters 110 and each of the driver ICs 120 configure a drive module 101. For example, one driver IC 120 is configured on a single semiconductor chip (as a single semiconductor device); however, a drive module 101 including one inverter 110 and one driver IC 120 may be configured as a single semiconductor device. Moreover, the inverters 110u, 110v, and 110w and the driver ICs 120u, 120v, and 120w may be configured as a single semiconductor device. Additionally, the semiconductor device may include the MCU 130.

The MCU 130 is a control unit of the motor drive system 100 and controls driving of the motor 140 by the inverters 110 via the driver ICs 120. The MCU 130 generates a PWM control signal PIN to control switching of the PMOS drive stages 111a and 111b in the inverters 110 and outputs it to the driver ICs 120. Also, the MCU 130 pertaining to the present embodiment generates a detection trigger signal TS to set a detection period (window) for which the driver ICs 120 are to detect noise in the drive output signals OUT of the inverters 110, as will be described later.

In the motor drive system 100 as described above, when turning the PMOS drive stages 111 on and off, ringing occurs in the voltage VDS (voltage VDS of the PMOS drive stage 111b) which is a drive output signal OUT. Ringing (noise) is a high frequency noise that occurs in an output signal when turning a switching element on or off. It can be said as a phenomenon that a signal oscillates and overshoots/undershoots when the signal rises or falls. Main causes of ringing occurrence are a reverse recovery current in a flywheel diode internal to a PMOS drive stage 111, parasitic capacitance internal to a PMOS drive stage 111, and resonance that occurs with switching of a PMOS drive stage 111, attributed to a circuit element such as a wiring inductor.

<Examination of Reference Examples>

As an example for reducing noise simultaneous with turn-on and turn-off like ringing, a conceivable example is to adjust the gate driving capability by adjusting the gate drive voltage and gate resistance of the PMOS drive stages 111. But, in such an example, adjustment is made in accordance only with a predetermined particular drive condition and, therefore, a problem is posed in which noise reduction is hard to optimize in a case where a load current varies over a wide range. Besides, the respective power devices which are mounted in the PMOS drive stages 111 have different device capacitance characteristics and different gate cutoff voltages and their switching characteristics differ and, therefore, a problem is posed in which adjustment with respect to each device is required.

Figure 2:
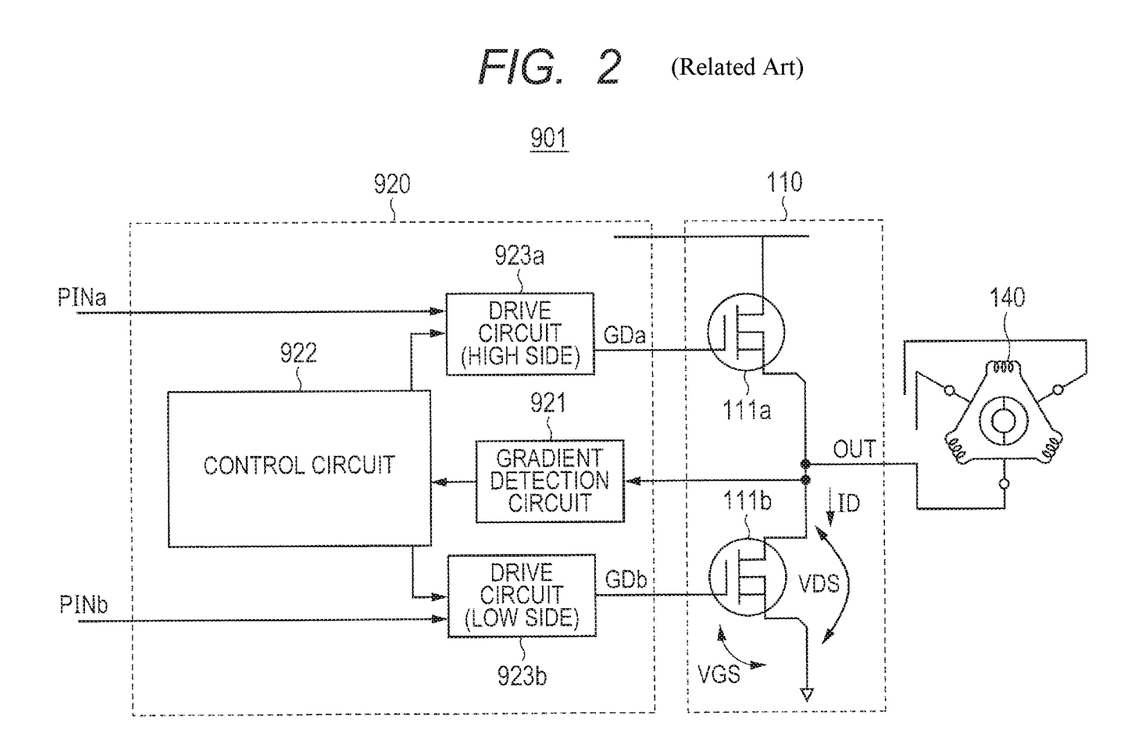
FIG. 2 is a configuration diagram depicting a configuration example of a driver IC which is a reference example.

Furthermore, an examination is made on a reference example as depicted in FIG. 2, as an example that can be conceived based on Patent Document 1. FIG. 2 depicts a configuration example of an inverter 110 and a driver IC 920 (a drive module 901) for one phase out of the three phases. As depicted in FIG. 2, the driver IC 920 of the reference example is equipped with a gradient detection circuit 921, a control circuit 922, a (high side) drive circuit 923a, and a (low side) drive circuit 923b.

The gradient detection circuit 921 detects a gradient of the voltage VDS (voltage VDS of the PMOS drive stage 111b) which is a drive output signal OUT, when turning the PMOS drive stages 111 on and off. The control circuit 922 controls driving by the drive circuits 923a and 923b depending on a gradient of the voltage VDS detected by the gradient detection circuit 921. The drive circuits 923a and 923b generate gate drive signals GDa and GDb depending on PWM control signals PINa and PINb from the MCU 130 and adjust the gate drive signals GDa and GDb to correct the gradient of the voltage VDS by control from the control circuit 922.

Figure 3:
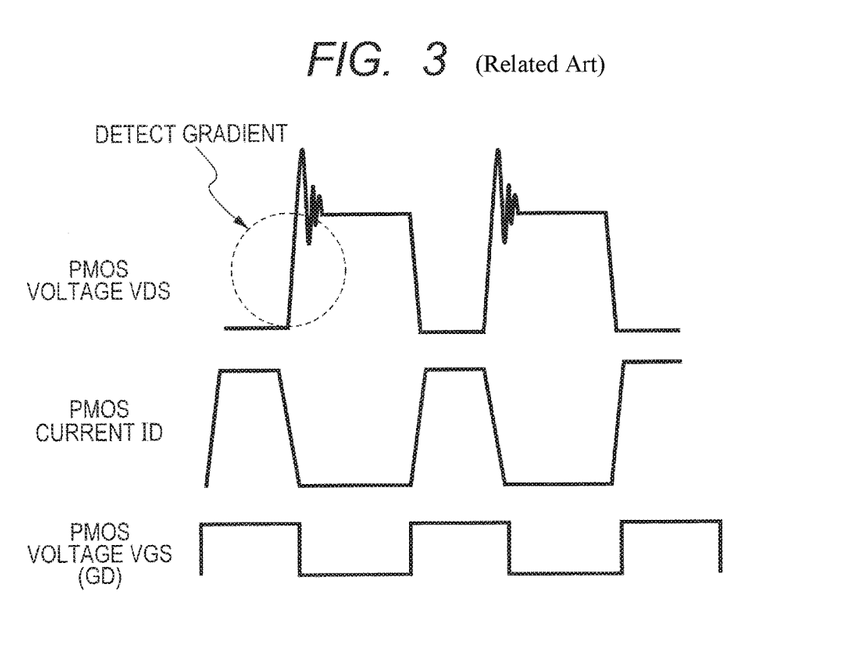
FIG. 3 is a waveform diagram to explain operation of the driver IC which is the reference example.

As depicted in FIG. 3, a drive circuit 923 (923a or 923b) generates a gate drive signal GD (GDa or GDb) depending on an input PWM control signal PIN (PINa or PINb) and a voltage VGS (a gate-source voltage of a PMOS transistor) of a PMOS drive stage 111 (111a or 111b) becomes to have a PWM pulse waveform. Then, the PMOS drive stage 111

(PMOS transistor) performs a switching operation depending on the voltage VGS and repeats on/off.

Consequently, a current ID (a drain current of the PMOS transistor) of the PMOS drive stage 111 repeats high/low in phase with the voltage VGS. When the voltage VGS rises, the current ID increases; when the voltage VGS falls, the current ID decreases. Besides, the voltage VDS of the PMOS drive stage 111 repeats high/low in reverse phase with the voltage VGS and the current ID. When the voltage VGS falls, the voltage VDS increases, because the PMOS drive stage 111 (PMOS transistor) is turned on; when the voltage VGS rises, the voltage VDS decreases, because the PMOS drive stage 111 is turned off.

Figure 4:
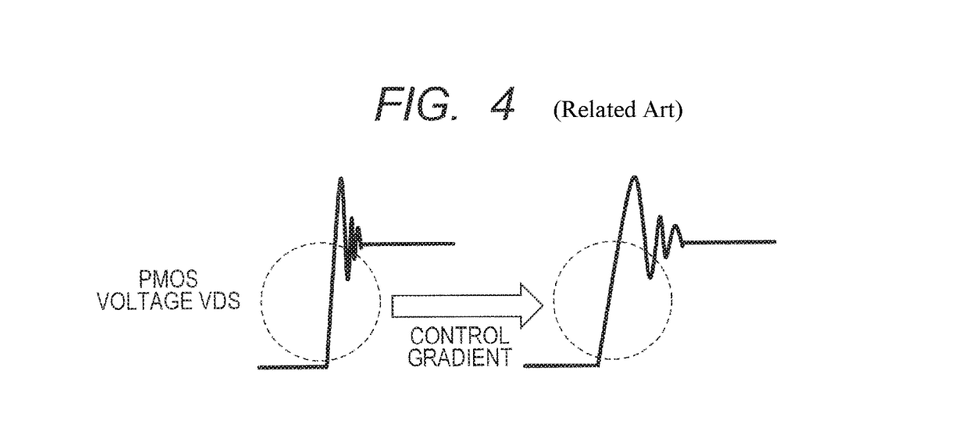
FIG. 4 is a waveform diagram to explain operation of the driver IC which is the reference example.

In the reference example, a rising voltage gradient of the voltage VDS is detected, as depicted in FIG. 3, and the rising voltage gradient of the voltage VDS is adjusted depending on the detected gradient, as depicted in FIG. 4. That is, in the reference example, a voltage gradient, not ringing (noise), simultaneous with turn on/off is detected and the gate drive circuit is controlled to adjust the voltage gradient. Hence, because a noise value is not controlled directly, a problem is posed in which a countermeasure against noise is hard to perform adequately.

So, the present embodiment enables it to control a switching operation in response to occurring noise such as ringing.

<General Description of a Driver IC of the First Embodiment>

This section generally describes a driver IC that is a major feature of the present embodiment.

A driver IC 120 pertaining to the present embodiment monitors the voltage VDS of a PMOS drive stage 111 during circuit operation, detect a noise level from an overshoot waveform when the drive stage is turned on or off, and controls the gate of the PMOS drive stage 111.

The driver IC 120 has a terminal for monitoring the voltage VDS of the PMOS drive stage 111 and a noise detection circuit (a noise detection circuit 121 which will be described later) that detects the voltage only for a turn-on or turn-off period of the monitored voltage VDS. This noise detection circuit sets a detection period in synchronization with a gate drive signal to detect an overshoot occurring in the voltage VDS when the drive stage is turned on or off. The detection period and timing are controlled by a detection trigger signal TS which is supplied from the MCS 130.

Also, the noise detection circuit has a DC converter (a DC converter 205 which will be described later) to convert a high frequency component causing the monitored voltage VDS to overshoot to a DC voltage. This DC converter outputs a DC voltage that corresponds to overshoot magnitude as well as amplitude and attenuation of an oscillation voltage from the voltage VDS during the above detection period. By the DC voltage output by the DC converter, a turn-on or turn-off waveform after elapse of a predetermined time is controlled, taking responsibility into account.

Moreover, a control circuit (a control circuit 122 which will be described later) of the driver IC 120 has a baseline table that gives a baseline of ringing. This control circuit reduces noise by automatically adjusting a gate drive condition (a gate drive current) and gradually adjusting a gradient of the voltage VDS so that the noise will conform to a particular baseline value that is selected by initial setting.

The present embodiment implements a semiconductor device (a circuit for generating a proper drive waveform) that is capable of reducing noise when the drive stage is turned on and off by adjusting the gate drive condition (gate drive current) for the PMOS drive stage depending on noise level in the manner described above.

<Configuration of a Driver IC of the First Embodiment>

Figure 5:
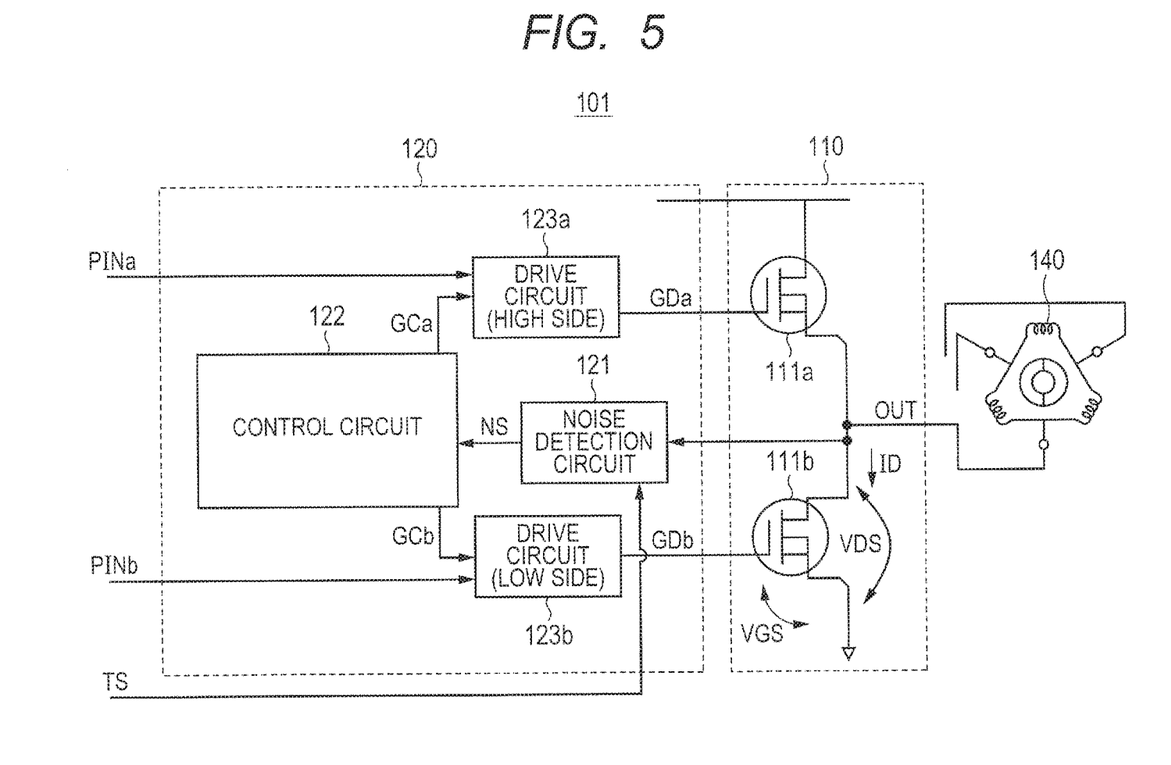
FIG. 5 is a configuration diagram depicting a configuration example of a driver IC pertaining to the first embodiment.

FIG. 5 depicts a configuration example of an inverter 110 and a driver IC 120 (a drive module 101) for one phase out of the three phases, as is the case with FIG. 2. And now, the inverters 110 and driver ICs 120 for three phases have the same configuration. As depicted in FIG. 5, a driver IC 120 pertaining to the present embodiment is equipped with a noise detection circuit 121, a control circuit 122, a (high side) drive circuit 123*a*, and a (low side) drive circuit 123*b*.

The noise detection circuit 121 detects noise in a drive output signal OUT when a PMOS drive stage 111 which is a switching element is switched on and off. The noise detection circuit 121 selects a given period from turn-on or turn-off of the PMOS drive stage 111 as a detection period to detect noise. When the PMOS drive stage 111 is turned on and off (or on or off), the noise detection circuit 121 detects noise in the voltage VDS (the voltage VDS of the PMOS drive stage 111*b*) which is a drive output signal OUT according to timing of a detection trigger signal TS and outputs the detected noise as a noise detection signal NS. For example, the noise detection circuit 121 sets a detection period (window) simultaneous with turn-on or turn-off depending on the detection trigger signal TS and detects an oscillation voltage during that period. Because the oscillation voltage of ringing (noise) varies depending on, for example, a current condition of a power device, output of the noise detection circuit 121 is made proportionate with a load current. For example, the noise detection circuit 121 outputs an average value (a DC component) of a noise component of a drive output signal OUT. Configuring the noise detection circuit 121 in this way enables it to detect noise reliably.

The control circuit 122 controls driving by the drive circuits 123*a* and 123*b* based on the detected noise. The control circuit 122 controls the drive circuits 123*a* and 123*b* based on a difference between the detected noise and the baseline value. This enables control depending on the noise that has occurred. The control circuit 122 generates gate control signals GCa and GCb to control driving by the drive circuits 123*a* and 123*b* depending on a noise detection signal NS that indicates noise in the voltage VDS detected by the noise detection circuit 121. The drive circuits 123*a* and 123*b* drive the control terminals (gates) of the PMOS drive stages 111*a* and 111*b*. For example, the drive circuits 123*a* and 123*b* control the gate drive current according to control of the control circuit 122 and adjusts a rising gradient or a falling gradient of a drive output signal OUT. This enables it to suppress noise effectively. The drive circuits 123*a* and 123*b* generate gate drive signals GDa and GDb depending on PWM control signals PINa and PINb from the MCU 130 and adjust the gate drive signals GDa and GDb to reduce noise in the voltage VDS depending on the gate control signals GCa and GCb from the control circuit 122.

Figure 6:
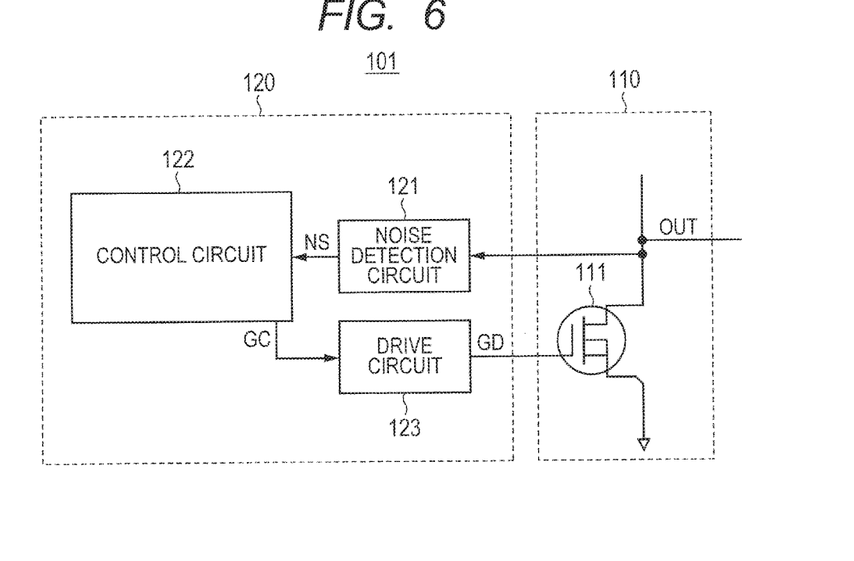
FIG. 6 is a configuration diagram depicting a configuration example of a driver IC pertaining to the first embodiment.

And now, in an instance where one PMOS drive stage 111 is to be driven, as depicted in FIG. 6, a driver IC 120 pertaining to the present embodiment may be equipped with at least a noise detection circuit 121, a control circuit 122, and a drive circuit 123.

<Control Circuit of the First Embodiment>

Figure 7:
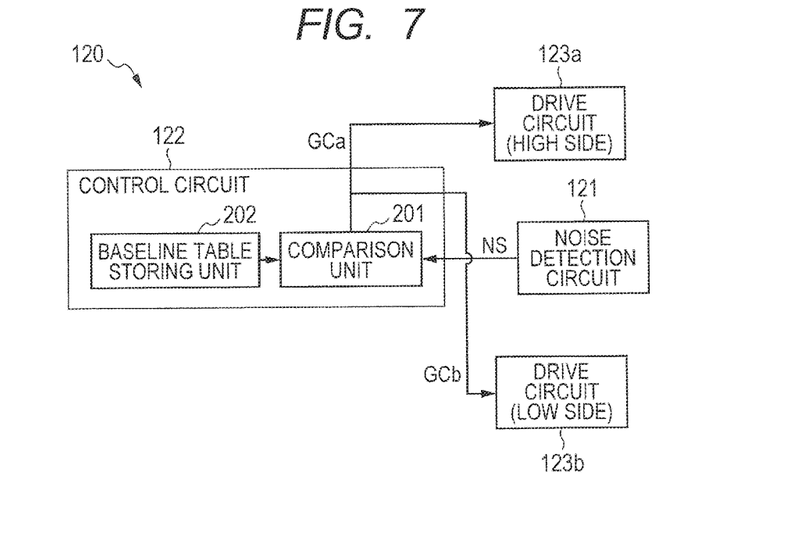
FIG. 7 is a configuration diagram depicting a configuration example of a control circuit pertaining to the first embodiment.

FIG. 7 depicts a configuration example of a control circuit 122 which is included in the driver IC 120 in FIG. 5. As depicted in FIG. 7, a control circuit 122 pertaining to the present embodiment is equipped with a comparison unit 201 and a baseline table storing unit 202.

The baseline table storing unit 202 stores a baseline table including a baseline value for detecting noise in the voltage VDS. A baseline value is set in advance depending on circuit configuration and characteristics, a drive condition, etc. The comparison unit 201 compares a noise voltage (noise detection signal NS) detected by the noise detection circuit 121 with the baseline value in the baseline table stored in the baseline table storing unit 202 and outputs a difference between them as gate control signals GCa and GCb. By such a configuration, control depending on noise is enabled simply. And now, plural baseline values may be set beforehand in the baseline table. For example, if noise is larger than a first baseline value, control may be executed to suppress the noise; if noise is smaller than a second baseline value (which is smaller than the first baseline value), control may be executed to stop noise suppression.

Figure 8:
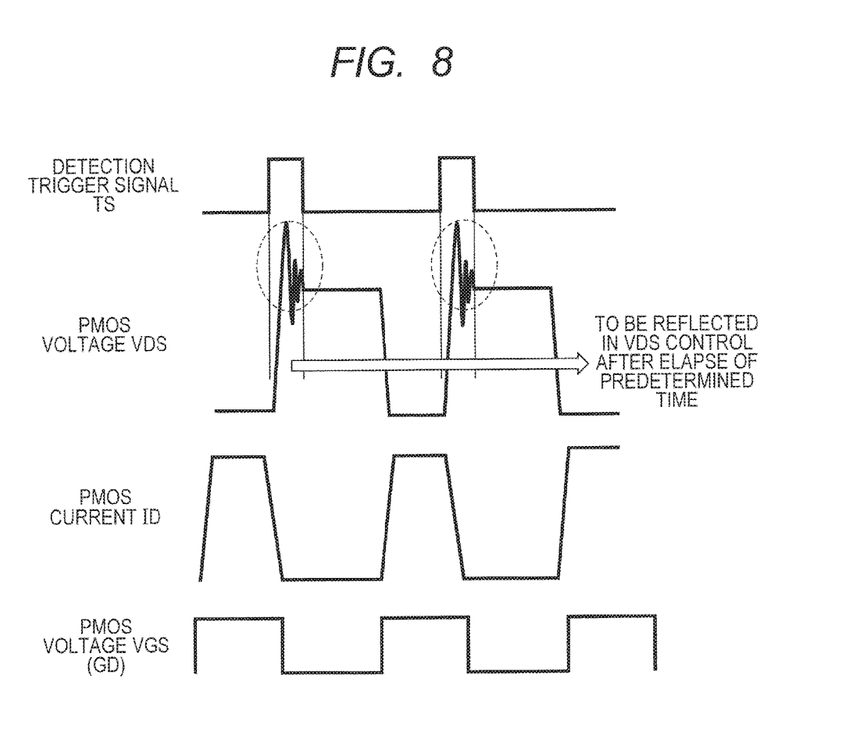
FIG. 8 is a waveform diagram to explain operation of the control circuit pertaining to the first embodiment.
Figure 9:
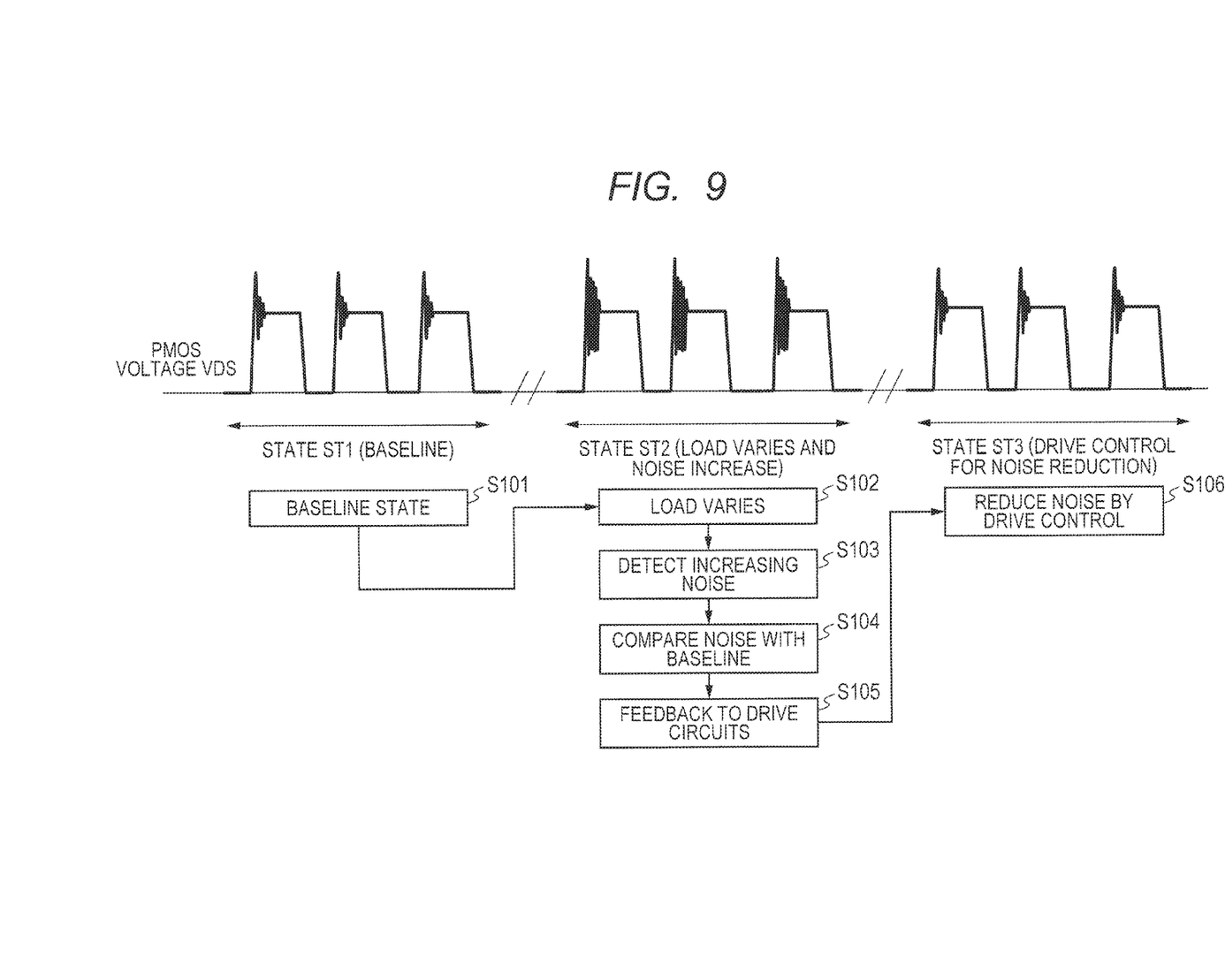
FIG. 9 is a waveform diagram and a flowchart to explain operation of the control circuit pertaining to the first embodiment.

Operation of the control circuit 122 pertaining to the present embodiment is described with a waveform diagram and a flowchart in FIGS. 8 and 9.

As depicted in FIG. 8, a drive circuit 123 (123a or 123b) generates a gate drive signal GD (GDa or GDb) depending on a PWM control signal PIN (PINa or PINb) which is input from the MCU 130 and outputs a voltage VGS having a PWM pulse waveform to a PMOS drive stage 111 (111a or 111b), as is the case for waveforms in the reference example in FIG. 3. The PMOS drive stage 111 repeats on/off depending on this voltage VGS and, consequently, the current ID of the PMOS drive stage 111 repeats high/low in phase with the voltage VGS and the voltage VDS of the PMOS drive stage 111 repeats high/low in reverse phase with the voltage VGS and the current ID.

The MCU generates a detection trigger signal TS that indicates detection timing, that is, a given period from rising (or falling) of the voltage VDS. For example, a period from a rising edge to a falling edge of the detection trigger signal TS is a detection period of the voltage VDS. The noise detection circuit 121 detects noise in the voltage VDS when the drive stage is turned on/off in synchronization with this timing of the detection trigger signal TS. When the noise detection circuit 121 detects noise at this timing, the comparison unit 201 in the control circuit 122 compares the detected noise with the baseline value. Depending on a result of the comparison, a quantity of noise is reflected in control of the voltage VDS after elapse of a predetermined time. By thus reflecting a quantity of noise in control after elapse of a predetermined time, stable control is enabled.

FIG. 9 illustrates a flow of operation, as the state of the voltage VDS of the PMOS drive stage 111 changes from ST1 to ST3.

First, state ST1 is a baseline state. In the baseline state, the PMOS drive stage 111 is controlled so that the voltage VDS remains less than a predetermined noise level (S101). For example, an adjustment is made to suppress noise within a predetermined range according to a particular drive condition which has been determined beforehand.

Then, noise increases, as the load varies in state ST2. When the noise level in the voltage VDS of the PMOS drive stage 111 changes, as the load varies (S102), the noise detection circuit 121 detects the noise level and detects the increasing noise (S103). The control circuit 122 compares the detected noise level with the baseline value (S104). If the noise level is more than the baseline value, the control circuit performs control for feedback to the drive circuits 123 (S105).

In consequence, drive control to reduce the noise is performed in state ST3. By controlling the drive circuits 123, the control circuit 122 controls the switching characteristic of the PMOS drive stage 111 so that the noise level will be suppressed (S106). This control operation is configured to exert control at a time delayed after the detection, not in real time, to enhance feedback stability of operation and feasibility of circuit implementation.

<Noise Detection Circuit of the First Embodiment>

Figure 10:
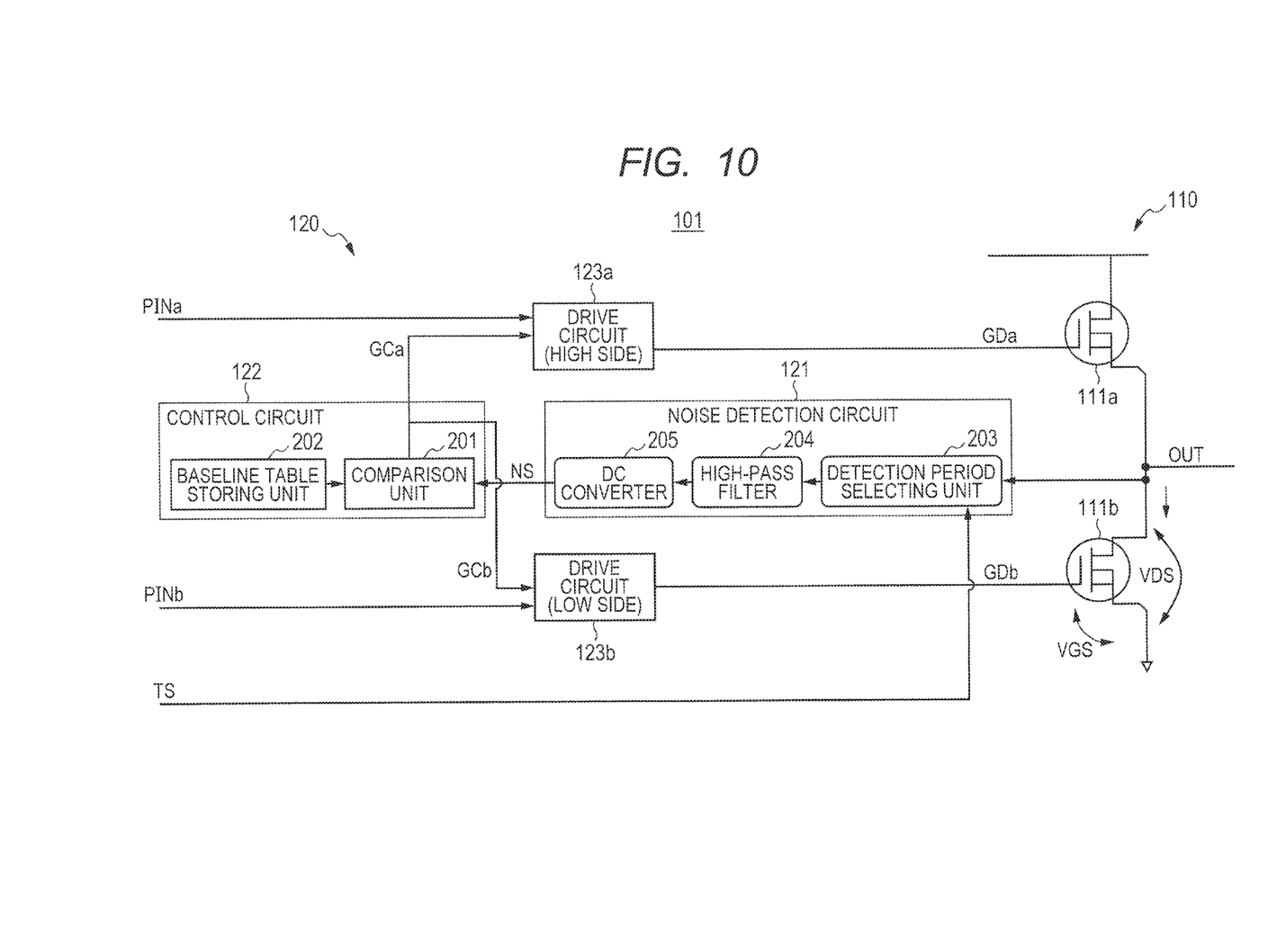
FIG. 10 is a configuration diagram depicting a configuration example of a noise detection circuit pertaining to the first embodiment.

FIG. 10 depicts a configuration example of a noise detection circuit 121 included in the driver IC 120 in FIG. 5. As depicted in FIG. 10, a noise detection circuit 121 pertaining to the present invention is equipped with a detection period selecting unit 203, a high-pass filter 204, and a DC converter 205.

The detection period selecting unit 203 selects a detection period (detection window) of the voltage VDS in accordance with the detection trigger signal TS from the MCU 130. And now, not limited to the detection trigger signal TS, it is only required that a given period from turn-off or turn-on of the PMOS drive stage 111 can be set as a detection period (may be based on a PWM control signal or the like). The high-pass filter 204 extracts only a high frequency component (noise component) during a selected detection period. The DC converter 205 averages the extracted high-frequency component (noise component) into a DC component and generates a noise detection signal NS. By such a configuration, noise can be detected simply.

Figure 11:
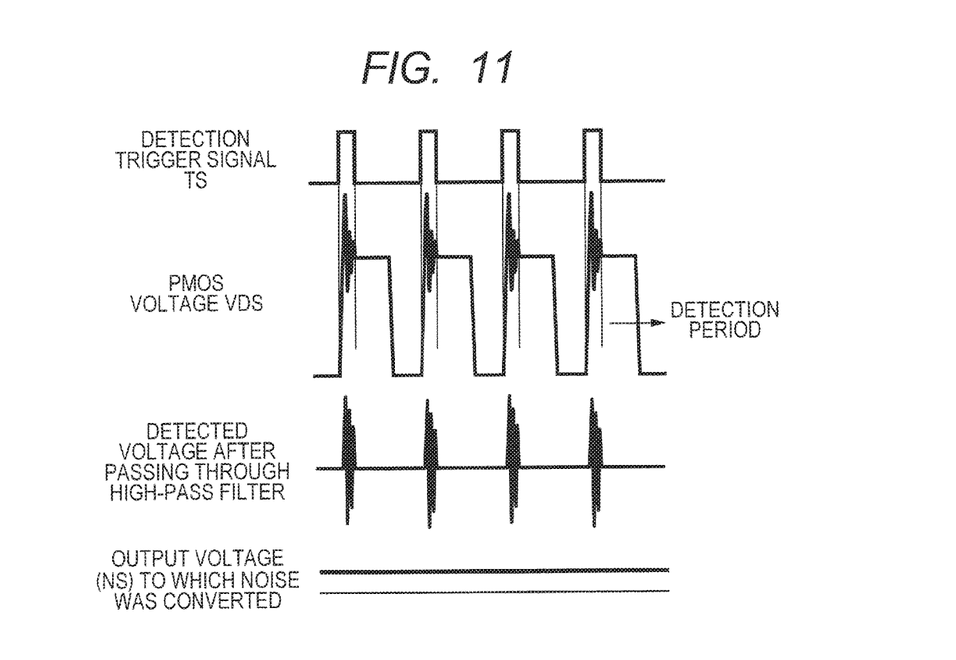
FIG. 11 is a waveform diagram to explain operation of the noise detection circuit pertaining to the first embodiment.

FIG. 11 depicts operating waveforms of the noise detection circuit 121 pertaining to the present embodiment. As depicted in FIG. 11, the detection trigger signal TS indicates timing of a detection period, that is, a given period from rising of the voltage VDS (turn-on/turn-off of the drive stage), as is the case with FIG. 8. And now, a given period from falling may be selected as a detection period. A given period that is selected as a detection period is set in advance depending on circuit configuration and characteristics, a drive condition, etc.

The detection period selecting unit 203 sets a detection period depending on the detection trigger signal TS which is supplied from the MCU 130 and a detection voltage is output only for that period. Because both a switching frequency and a ringing frequency are included in this detection voltage, the switching frequency is removed by the high-pass filter 204 and the detection voltage after passing through the high-pass filter has only the ringing component (noise component). The DC converter 205 converts a ringing waveform into a DC voltage and outputs the DC voltage as a noise detection signal NS to the control circuit 122. This noise detection signal NS is compared with the baseline value in the control circuit 122.

<Drive Circuit of the First Embodiment>

Figure 12:
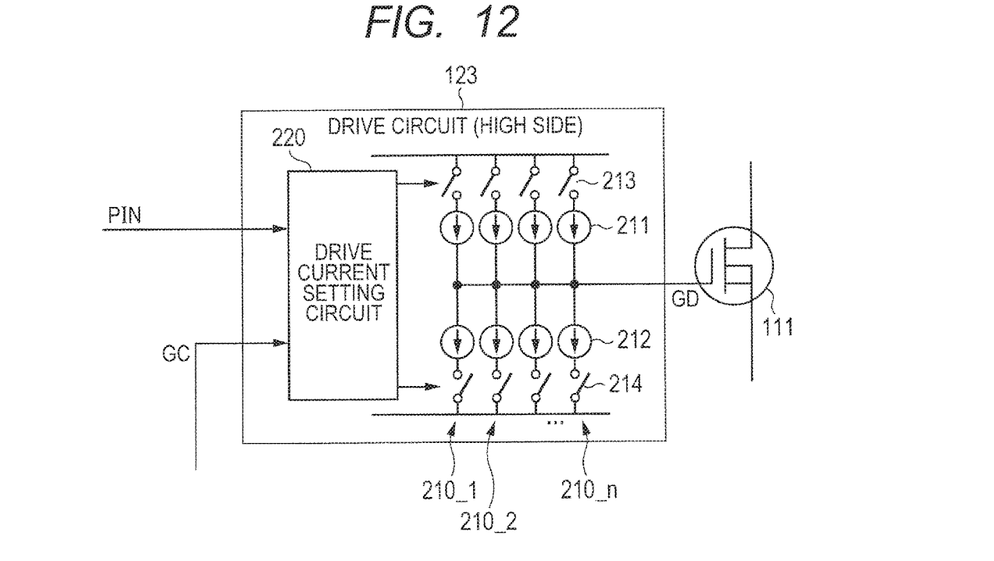
FIG. 12 is a configuration diagram depicting a configuration example of a drive circuit pertaining to the first embodiment.

FIG. 12 depicts a configuration of a drive circuit 123 which is included in the driver IC 120 in FIG. 5. As depicted in FIG. 12, a drive circuit (which is, e.g., a high side drive circuit 123a; a low side one is also identical to that circuit) is equipped with plural current source circuits 210 (210_1 through 210_n) and a drive current setting circuit 220. Noise reduction can be achieved simply by such configuration.

The current source circuits 210 are current sources that supply a gate drive current to a PMOS drive stage 111. Each of the current source circuits 210 has a first current source 211 and a second current source 212 coupled in series between the first power supply and the second power supply and an intermediate node between the first current source 211 and the second current source 212 is coupled to the gate of the PMOS drive stage 111 (PMOS transistor). Each current source circuit also has a first switch 213 to control current supply by the first current source 211 between the first power supply and the first current source 211 and a second switch 214 to control current supply by the second current source 212 between the second power supply and the second current source 212.

The drive current setting circuit 220 sets a current of a gate drive signal GD by switching the first switch 213 and second switch 214 on/off in each of the plural current source circuits 210. In synchronization with timing of a PWM control signal PIN which is input from the MCU 130, the drive current setting circuit 220 turns the first switch 213 and second switch 214 on/off in each of the plural current source circuits 210 and thus generates a gate drive signal GD. Moreover, in response to a gate control signal GC from the control circuit 122, the drive current setting circuit 220 selects a subset of the current source circuits 210 (210_1 through 210_n), for a subset of which the first switch 213 and second switch 214 should be turned on/off, that is, a subset of the current source circuits to drive the PMOS drive stage 111 and thus controls the gate drive current (the current of the gate drive signal GD). For example, if the gate control signal GC is large (there is a large difference between noise and the baseline value), the gate drive current is to be decreased by decreasing the number of current source circuits 210 for which the first switch 213 and second switch 214 should be turned on/off. If the gate control signal GC is small (there is a small difference between noise and the baseline value), the gate drive current is to be increased by increasing the number of current source circuits 210 for which the first switch 213 and second switch 214 should be turned on/off.

Figure 13:
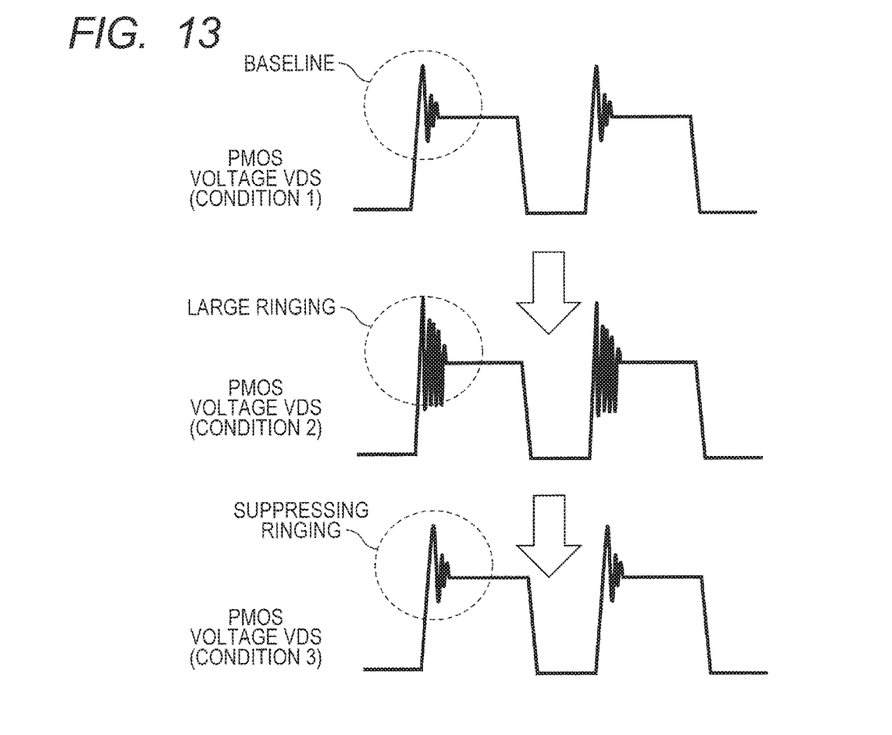
FIG. 13 is a waveform diagram to explain operation of the drive circuit pertaining to the first embodiment.
Figure 14:
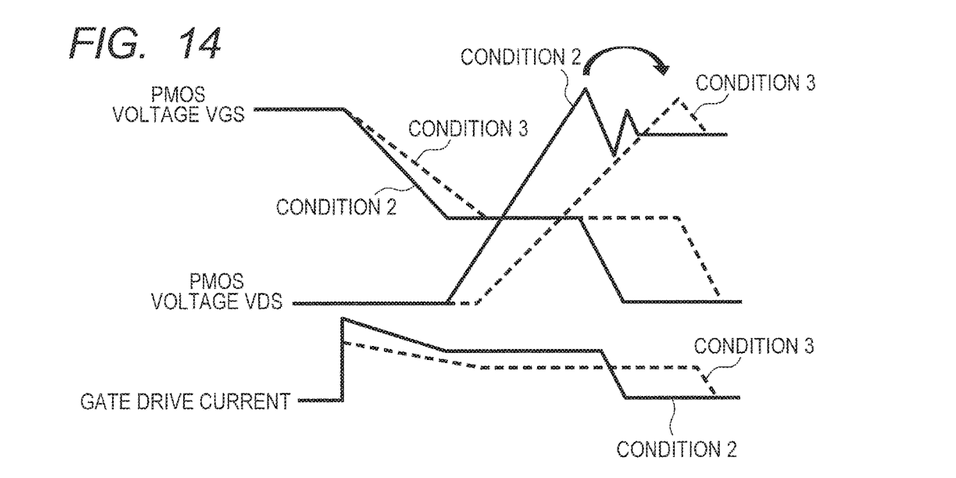
FIG. 14 is a waveform diagram to explain operation of the drive circuit pertaining to the first embodiment.

FIGS. 13 and 14 depict waveforms of the voltage VDS in Conditions 1 through 3 as an example of operation of a drive circuit 123 of the present embodiment. As depicted in FIG. 13, a waveform of the voltage VDS in Condition 1 (baseline state) is assumed to indicate ringing as per baseline. Then, when ringing becomes intense due to load variation and characteristics of the PMOS drive stage 111, as seen in Condition 2, the noise detection circuit 121 converts the magnitude of the ringing into a DC voltage and outputs the DC voltage. In turn, the drive circuit 123 adjusts the gate current, thus suppressing the ringing, as seen in Condition 3. In the present embodiment, by controlling the gate drive current (constant current driving), the switch time is changed and the noise is suppressed.

Specifically, in comparing Condition 2 and Condition 3, in Condition 2, because the gate drive current is large and the period of application of the gate voltage VGS is short, the gradient of the voltage VDS is steep and ringing is large, as depicted in FIG. 14. Hence, in Condition 3, the gate drive current is decreased and the period of application of the gate voltage is made longer. This makes the gradient of the voltage VDS gentle and can suppress ringing.

<Advantageous Effects of the First Embodiment>

As described hereinbefore, in the present embodiment, the driver IC that drives a PMOS (a PMOS transistor of a PMOS drive stage) is equipped with the noise detection circuit to detect noise in an output voltage of the PMOS. In detecting noise, ringing causing the output voltage to overshoot is converted into a DC voltage and, based on a result of comparing this DC voltage with an internal baseline voltage, the gate current is controlled, so that the gradient of the output voltage is controlled. Thereby, noise simultaneous with turn-on or turn-off can be reduced properly, regardless of a drive condition.

A ringing waveform of a PMOS and noise produced by it changes depending on selection of constituent circuits and output-stage devices as well as load variation. Hence, as done in the present embodiment, by monitoring a ringing part of the waveform and picking up a voltage corresponding to a high frequency component included in the ringing part, it is possible to implement control to suppress noise to a constant value automatically, as the load varies. Also, it would become possible to simplify design concerning noise that changes depending on devices, a circuit configuration, and a load condition.

While the invention made by the present inventors has been described specifically based on its embodiment hereinbefore, it will be appreciated that the present invention is not limited to the embodiment described previously and various modifications may be made thereto without departing from the gist of the invention.

What is claimed is:

1. A semiconductor device comprising:
   a drive circuit which drives a control terminal of a switching element;
   a detection circuit which detects noise in an output signal when switching the switching element on or off; and
   a control circuit which controls driving by the drive circuit based on the detected noise,
   wherein the detection circuit selects a given period from turn-on or turn-off of the switching element as a detection period to detect the noise.

2. The semiconductor device according to claim 1, wherein the detection circuit selects the detection period depending on a detection trigger signal that is input thereto.

3. The semiconductor device according to claim 1, wherein the detection circuit detects an average value of a noise component in the output signal during the detection period.

4. The semiconductor device according to claim 1, wherein the detection circuit comprises:
   a detection period selecting circuit which selects the detection period;
   a high-pass filter which allows a high frequency component in the output signal to pass therethrough during the selected detection period; and
   a converter which converts a high frequency component signal passed through the high-pass filter to a DC component signal.

5. The semiconductor device according to claim 1, wherein the control circuit controls driving by the drive signal based on a difference between the detected noise and a baseline value.

6. The semiconductor device according to claim 5, wherein the control circuit comprises:
   a storage unit which stores the baseline value; and
   a comparison unit which compares the detected noise with the stored baseline value.

7. The semiconductor device according to claim 1, wherein the drive circuit adjusts a rising or falling gradient of the output signal according to control by the control circuit.

8. The semiconductor device according to claim 7, wherein the drive circuit adjusts a drive current to drive the control terminal according to control by the control circuit.

9. The semiconductor device according to claim 8, wherein the drive circuit comprises:
   a plurality of current sources which supply a drive current to the control terminal; and
   a selection circuit which selects a subset of the current sources to supply a drive current to the control terminal according to control by the control circuit.

10. A semiconductor device comprising:
    a high side drive circuit which drives a control terminal of a high side switching element;

a low side drive circuit which drives a control terminal of a low side switching element;

a detection circuit which detects noise in an output signal when switching the high side switching element or the low side switching element on or off; and a control circuit which controls driving by the high side drive circuit and the low side drive circuit based on the detected noise, wherein the detection circuit selects a given period from turn-on or turn-off of the switching element as detection period to detect the noise.

11. The semiconductor device according to claim 10, wherein the detection circuit selects the detection period depending on a detection trigger signal that is input thereto.

12. The semiconductor device according to claim 10, wherein the detection circuit detects an average value of a noise component in the output signal during the detection period.

13. The semiconductor device according to claim 10, wherein the detection circuit comprises:

a detection period selecting circuit which selects the detection period;

a high-pass filter which allows a high frequency component in the output signal to pass therethrough during the selected detection period; and a converter which converts a high frequency component signal passed through the high-pass filter to a DC component signal.

14. A control method for a semiconductor device having a drive circuit which drives a control terminal of a switching device, the control method comprising:

detecting noise in an output signal when switching the switching element on or off; and controlling driving by the drive circuit based on the detected noise, wherein the detecting noise includes selecting a given period from turn-on or turn-off of the switching element as a detection period to detect the noise.

15. The control method according to claim 14, wherein the detecting noise includes selecting the detection period depending on a detection trigger signal that is input thereto.

16. The control method according to claim 14, wherein the detecting noise includes detecting an average value of a noise component in the output signal during the detection period.

17. The control method according to claim 14, wherein the detecting noise includes:

selecting the detection period;

allowing a high frequency component in the output signal to pass therethrough a high-pass filter during the selected detection period; and converting a high frequency component signal passed through the high-pass filter to a DC component signal.

* * * * *